United States Patent [19]

Pulyer

[11] 4,238,831

[45] Dec. 9, 1980

[54] PULSE INTERPOLATION METHOD AND APPARATUS

[75] Inventor: Yuly M. Pulyer, Pittsburgh, Pa.

[73] Assignee: Westinghouse Air Brake Company, Swissvale, Pa.

[21] Appl. No.: 939,023

[22] Filed: Sep. 1, 1978

[51] Int. Cl.³ .......................... G06J 3/00; H03K 13/02
[52] U.S. Cl. ............................ 364/608; 340/347 DA; 340/347 M; 328/127; 328/156
[58] Field of Search .................. 340/347 M, 347 DA; 307/261; 328/181, 127, 154–156, 160; 364/607; 364/608

[56] References Cited

U.S. PATENT DOCUMENTS

| | | | |
|---|---|---|---|
| 3,586,839 | 6/1971 | Grado | 340/347 M X |
| 3,656,152 | 4/1972 | Gundersen | 340/347 AD |
| 3,877,023 | 4/1975 | Spicer et al. | 340/347 DA |
| 4,030,038 | 6/1977 | Daniel et al. | 328/127 |

OTHER PUBLICATIONS

Schmid, Electronic Analog/Digital Conversions, Van Nostrand Reinhold Co., 1970, pp. 170–172.
The Engineering Staff of Analog Devices, Inc., Analog-Ditgital Conversion Handbook, 6/72, pp. I-26 to I-33; III-78, 79.

Primary Examiner—Thomas J. Sloyan
Attorney, Agent, or Firm—A. G. Williamson, Jr.; R. W. McIntire, Jr.

[57] ABSTRACT

Received periodic pulses of varying amplitude, representing a measured analog signal, are alternately applied to two interpolation channels through gates alternately activated by a flip-flop element responsive to each incoming pulse. Each channel converts the applied pulses into an interpolated value which is summed with that of the other channel to substantially reproduce the original analog signal value. In a first specific arrangement, each pulse is converted, by the integration of the stored pulse amplitude, into a triangular shaped signal having a height equal to the corresponding pulse amplitude and a base equal to twice the pulse spacing. The successive triangular signals from each channel, each overlapping the adjacent pulse signals from the other channel, are summed to produce an interpolated analog output substantially equivalent to the original analog signal. In a second arrangement, the triangular pulses are formed by generating sine and cosine functional waves with the amplitude of each single half cycle selected in accordance with that of the corresponding digital pulse. A third arrangement uses cosine² functions to provide the interpolation values.

8 Claims, 16 Drawing Figures

PULSE INTERPOLATION METHOD AND APPARATUS

BACKGROUND OF THE INVENTION

My invention relates to a pulse interpolation method and apparatus therefor. More specifically, the invention pertains to circuit arrangements for restoring received amplitude modulated pulses to an original analog signal form.

It is known to convert an analog signal representing the measured value of a function at a remote location into a pulse signal form, e.g., a series of discrete amplitude modulated pulses, for transmission over a communication channel to a central location. In order to register and/or indicate the condition of the remote function in a form equivalent to the original measurement, it is then necessary to restore or reconstitute the received pulse signals into an analog signal at least substantially equivalent to that analog signal initially existing at the remote location. This reconversion should be as accurate and reliable as possible. However, present circuit arrangements for converting from a series of pulse signals of varying amplitude to an analog signal, because of delay times and other inherent characteristics and operating principles, do not reproduce an analog signal substantially equivalent to the original form as consistently and accurately as desired. An improved arrangement is needed and desirable.

Accordingly, an object of my invention is an improved method for converting pulse signals of varying amplitudes into the analog signal function which the pulses represent.

Another object of the invention is improved apparatus for reconverting variable amplitude pulses into an analog signal substantially equivalent to that signal from which the pulses were derived.

A further object of the invention is a circuit arrangement for use at a central station in a remote function indicating system to reconvert pulse signals of varying amplitude, received from a remote station and representing an analog measurement of the condition of the indicated function, into an analog signal substantially equivalent in derivatives and magnitude to that signal measured at the remote station.

Yet another object of my invention is a method of accurately converting discrete variable amplitude pulse signals into an equivalent analog signal function by successively producing and summing overlapping triangle or $\cos^2 \omega t$ areas, each having a height equal to a selected pulse signal and a base equal to twice the time space between consecutive pulses.

A further object of the invention is a method of converting amplitude modulated pulses into an equivalent analog signal by producing a continuously interpolated signal from a generated $\cos^2$ function signal in accordance with the amplitude of the successive digital signals as alternately decoded in parallel memory channels.

Other objects, advantages, and features of the invention will become apparent from the following specification and appended claims when taken with the accompanying drawings.

SUMMARY OF THE INVENTION

According to the invention, restoration of received discrete pulses of varying amplitude into an analog signal, substantially equivalent to the original analog measurements which the pulses represent is accomplished by interpolation. Under a first concept, each received pulse is converted into a triangular form and integrated to provide the interpolated value of the analog signal between that pulse and the succeeding pulse. This results in a straight line curve between the amplitude values of adjacent pulses which represents the chord between the two points on the original smooth curve signal corresponding to the adjacent pulse amplitudes. The connected series of such chords thus reproduces with substantial accuracy the originally measured analog value curve. In the circuit arrangement for the first concept, the successive received pulses are alternately applied to two channels, each including a memory element, a digital to analog converter, and an integrator. The value of the triangular pulse from the memory is integrated during the succeeding pulse period. The outputs of each channel are summed to produce an interpolated analog signal substantially equivalent to that measured at a remote location. In a second concept, the received pulses are interpolated using developed cosine-sine signals. The circuit network for this second concept also has two channels to which the received signals are alternately applied and passed into a memory element. An auxiliary channel associated with each channel forms the cosine-sine signal equivalent which is rectified and gated to the output to provide the interpolated chord function analog signal output.

A third form is based on using a $\cos^2$ interpolation model which enables the conversion of a two-phase signal into an original analog format if two phase detection channels are available for transmission.

BRIEF DESCRIPTION OF THE DRAWINGS

I shall now describe in a more specific detail the several arrangements embodying the invention, referring from time to time to the accompanying drawings in which:

FIG. 2a is a schematic circuit diagram showing a conventional apparatus arrangement for restoring a series of pulse signals to analog form.

FIGS. 2b, 2c are charts which assist in understanding the logic sequence operation of the circuit arrangement of FIG. 2a.

FIG. 4a is a schematic circuit diagram showing one arrangement embodying the invention.

FIG. 4b is a chart useful in explaining the operation of the apparatus of FIG. 4a.

FIG. 5a is a schematic diagram of another circuit and apparatus arrangement embodying the invention.

FIG. 5b is a chart illustrating the operation of the apparatus of FIG. 5a.

Figure 1:
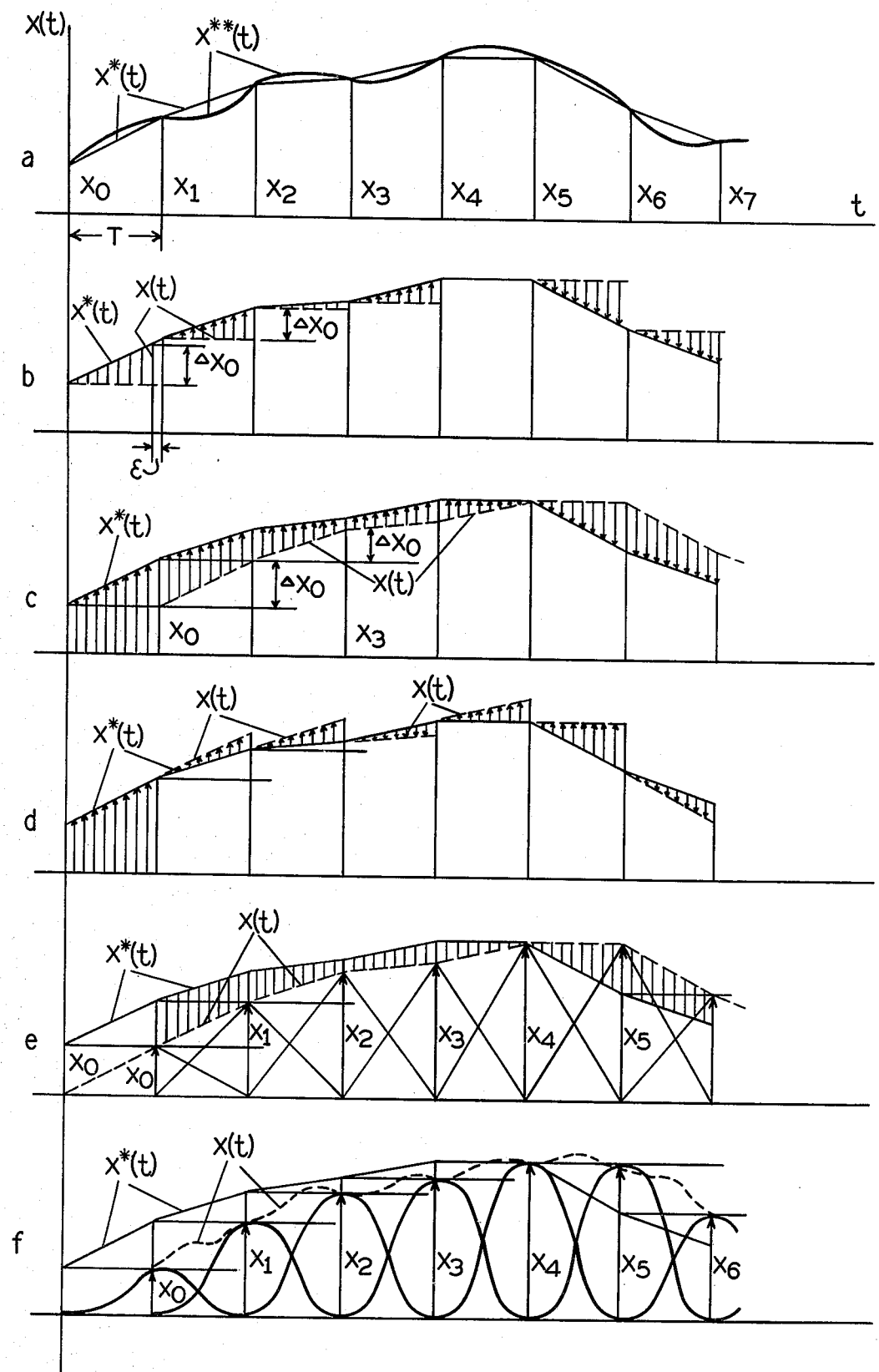
FIGS. 1a to f are several charts illustrating various aspects and methods of converting pulse signals into an equivalent analog form.
Figure 6:
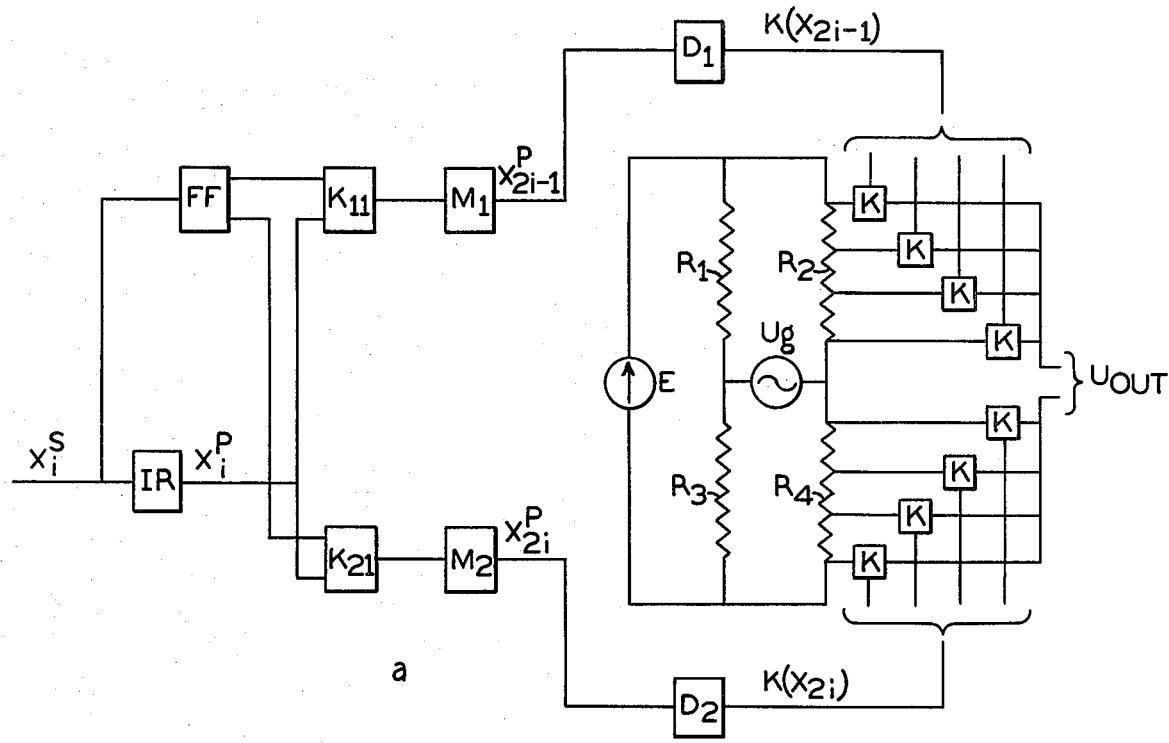
FIG. 6a is a schematic illustration of still another circuit arrangement embodying the invention.
FIG. 6b is a schematic diagram showing equivalent circuits which jointly simulate the operation of the FIG. 6a arrangement.
Figure 6:
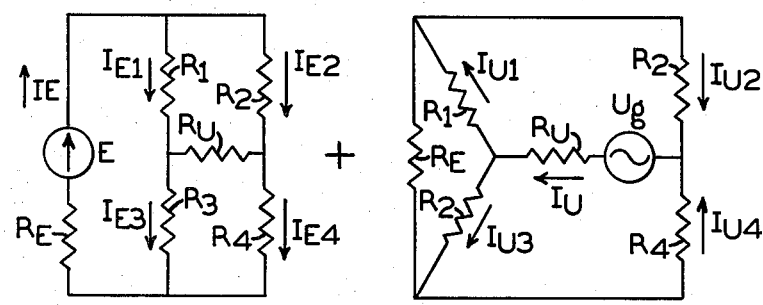

In each of the drawing figures, similar references designate the same or similar apparatus or functions. The following list of symbols pertains to the drawings and also to the following description:

E: constant voltage source (FIG. 6)

I: current through the diode
$I_m$: maximum current through the diode
$I_{E1}, I_{E2}, I_{E3}, I_{E4}$: currents in the bridge resistors produced by the constant voltage source E
$I_U, I_{U2}, I_{U4}$: currents in the bridge resistors produced by the harmonic voltage source $U_g$ of amplitude U cos $\pi/T$ (FIG. 6)
R: resistor in the diode branch
Sa(t): count pulse function
T: interpolation period
$U_R$: voltage on the diode resistor
$U_d$: diode voltage
$U_g$: harmonic voltage source (FIG. 6)
i: pulse number
t: time
X(t): chord interpolation function with a delay
X*(t): chord interpolation function
X**(t): initial smooth function
$X_i(t)$: pulse of function X(t)
$X_i^{DS}$: discrete pulse series
$X_i^{DP}$: parallel digital pulses
$X_{2i}$: even function count
$X_{2i-1}$: odd function count
$X_i(t)$: interpolation signal obtained by means of pulse function $\cos^2$
$\Delta X_o$: error of interpolation
$\Delta X_1(t)$: current error of interpolation
$\Delta X(t)$: error of interpolation
$\Delta X_{i-1}$: decrement of the scanning function
$\Delta \phi$: interpolation error
$\nu = t/2T$: relative pulse time
$\phi_{2i}(t-ti)$: even pulse interpolation function
$\phi_{2i-1}(t-ti)$: odd pulse interpolation function
$\omega_c$: angular frequency
K: switch or gate device
FF: flip-flop type memory element

DESCRIPTION OF ILLUSTRATED EMBODIMENTS

Referring to the drawings, FIG. 1a shows the chord interpolation function X*(t) of an initial smooth or analog function X**(t). We will use the reference X(t) to designate the ideal interpolation model which is used for comparison with all the pulse interpolation models considered hereinafter.

FIG. 1b shows a simple conventional interpolation which has a delay error $\Delta X_o$. In this and subsequent charts of FIG. 1, the shaded areas represent delay times. It is usually used in the digital analog converter (d.a.c.) but it does not restore smoothness and therefore it is not under consideration. FIG. 1c shows a linear chord interpolation which has also a delay error but restores smoothness. Such interpolation might be realized by two math models which are mathematically identical but have different circuit realization. The first of these, which is also traditional (FIG. 1c), is:

$$X_i(t) = X_{i-1} + \Delta X_{i-1}(t/T - i) \qquad (1)$$

where:

$$iT \leq t \leq (i+1)T$$

FIG. 1d shows a linear chord interpolation with a smooth interruption error while FIGS. 1e, 1f show pulse interpolation math models having delay errors.

Figure 2:
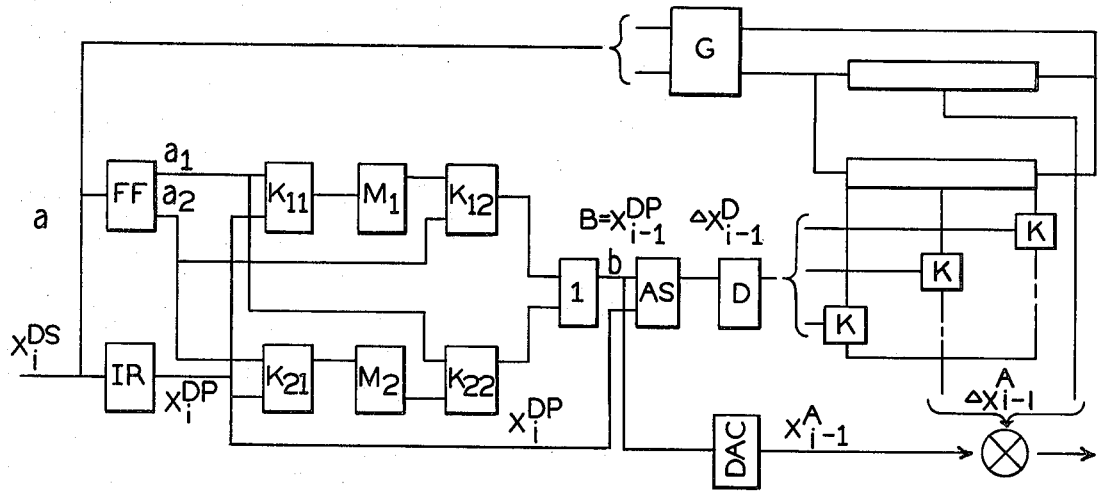

The circuit variant according to the math model (1) is shown in FIG. 2a. The process in this variant is evident in the table of FIG. 2b which contains function logical circuits (f.l.c.) to illustrate the cause-effect connections between the input-output signal in each element. Hence, we can show the whole signal cascade travel (quantitatively and qualitatively) from input to ouput. Such f.l.c. is shown for the four time steps from the beginning of the process the digital parts of the circuits considered. The first time step i=0 is not effective, as is evident from FIG. 1c and table FIG. 2b. The structure of FIG. 2a consists of two symmetrical channels, the first of which, the top channel, is the even number channel, the second or lower channel is the odd number channel. The even channel is for the even pulse series, the odd channel for the odd pulse series. In FIG. 2a, the input register-converter IR transforms the serial pulses to parallel code, while the input flip-flop or switch FF controls even and odd channel switches $K_{11}$ and $K_{21}$ to alternately open the inputs to memory units $M_1$ and $M_2$. Switches $K_{12}$ and $K_{22}$ are used to open the inputs of the OR block 1. Such structure that is also suggested by the f.l.c., FIG. 2b signifies the situation in which the logical OR output has to store count $X_{i-1}$ during the whole i-th current time interval. Index DS designates the series pulses, index DP, the parallel pulses. So the structure of FIG. 2a provides the possibility of having $X_i$ and $X_{i-1}$ simultaneously to obtain the increment $\Delta X_i = X_i - X_{i-1}$ by means of adder-subtracter block AS. Switches K used to determine the analog voltage $(\Delta X_{i-1})$max are selected from parallel decoder D.

The bridge potentiometer block is fed from triangular pulse generator G synchronized by means of the input pulse series $X_i^{DS}$. Thus, this scanning block is used to obtain the linear increment according to model (1). So the sum according to model or equation (1), given in the output from the circuit structure of FIG. 2a, is the result of the computation for every interpolation period T. The above mentioned math model has a delay error (FIG. 1c) in contrast to the next one (FIG. 1d). The time diagram (FIG. 2c) is given to illustrate the timing of the digit block to obtain the math modeling according to equation (1).

The math model of similar interpolation according to FIG. 1d is:

$$X_i(t) = X_i + \Delta X_{i-1}(t/T - i) \qquad (2)$$

where:

$$iT \leq t \leq (i+1)T$$

Comparison of math models (2) and (1) shows the following difference: $X_{i-1}$ in (1) and $X_i$ in (2), the increment function being the same. Such a situation determines the interpolation error at the end of interpolation period T:

$$\Delta X^*(t) \approx X_i T^2(t/T - i)$$

$$iT \leq t \leq (i+1)T$$

The circuit realization of the math model (2) is obviously close to the structure of FIG. 2a because of the above-mentioned minor difference between the math models. Therefore, such a circuit is not shown. The principal defect of the above-mentioned interpolation structures is the interruption effect in the smooth curve at the end of any interpolation period T during the code change time in the memory output and in the end of the saw-tooth pulse of the scanning generator.

Figure 3:
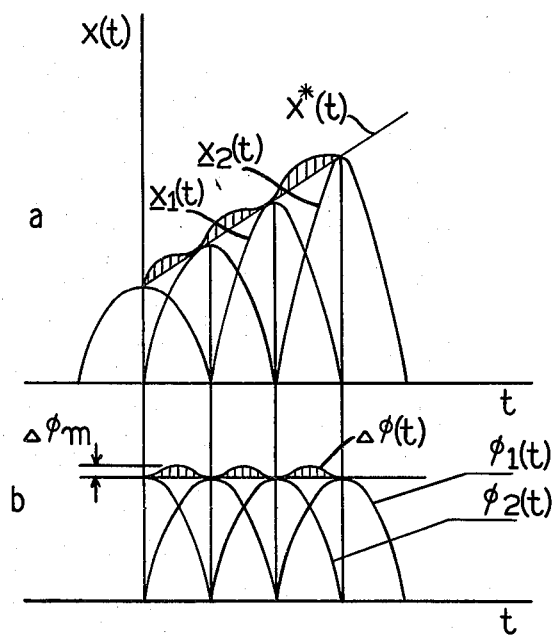
FIG. 3 is a chart useful in understanding the concept of pulse interpolation in restoring an analog signal.

The pulse interpolation is the approximate formulation of the initial smooth function by means of summing up two pulse series, which have the necessary properties, using the available conventional technology and convergence to the initial function. Such pulse series must have phase shift T and pulse-period 2T (FIGS. 3a, 3b).

The general pulse interpolation formula in question may be written:

$$X = \sum_{i=0}^{m} [X_{2i}\phi_{2i}(t - t_i) + X_{2i-1}\phi_{2i-1}(t - t_i)] \quad (3)$$

where:

$$t_{2i-1} \leq t \leq t_{2i}$$

and $X_{2i}$, $\phi_{2i}$, $X_{2i-1}$, $\phi_{2i-1}$ designate even and odd counts and corresponding unit pulse interpolation functions, respectively.

In the case of a stable T period of interpolation and $t_i = iT$ we can write:

$$X = \sum_{i=0}^{m} \left[ X_{2i}\phi_{2i}\left(\frac{t}{T} - i\right) + X_{2i-1}\phi_{2i-1}\left(\frac{t}{T} - i\right) \right] \quad (4)$$

where:
$$\phi_{2i-1}(t) = \phi_{2i}[(t/T - i - 1)]$$

(see FIG. 3a).

The criterion for functions $\phi_{2i}$ and $\phi_{2i-1}$ may be accepted as:

(1) The pulse duration must not be more than 2T to obtain a minimum delay error.
(2) The pulse function must satisfy $\phi(iT) = 1$.
(3) Convergence is as follows:

$$\lim_{T \to 0} |\Delta \phi|_{max} = \lim_{T \to 0} \left|1 - \left[\phi_{2i}\left(\frac{t}{T} - i\right) + \phi_{2i-1}\left(\frac{t}{T} - i\right)\right]\right|_{max} = 0 \quad (5)$$

$$t_i \leq t \leq t_{i+1}$$

According to such conditions, it is possible to obtain mathematically a class of the pulse functions. However, this math synthesis is not covered herein and we will use only two pulse function groups, which meet the above conditions, as follows:

(1) Triangular pulses with amplitude $X_i$ and base 2T.
(2) Pulse Functions:

$$X_i \cos^2 \pi/2T(t-t_1)$$

The chord interpolation math model (1) may be transformed in another identical form assuming that $\Delta X_{i-1} = X_i - X_{i-1}$ $$X_i^*(t) = X_{i-1} + \frac{\Delta X_{i-1}}{T}(t - t_i) = \quad (6)$$

$$= X_{i-1}\underbrace{\left(1 - \frac{t - t_i}{T}\right)}_{\phi_{i-1}} + X_i \underbrace{\frac{t - t_i}{T}}_{\phi_i}$$

$$t_i \leq t \leq t_{i+1}$$

For the next interpolation period we can write, changing index i:

$$X_{i+1}^*(t) = X_i \underbrace{\left(1 - \frac{t - t_{i+1}}{T}\right)}_{\phi_i} + X_{i+1} \underbrace{\frac{t - t_i}{T}}_{\phi_{i+1}} \quad (7)$$

$$t_i \leq t \leq t_{i+1}$$

Comparison of equations (6) and (7) shows that the functions with the same indexes $\phi_i$ in (6) and (7) form two sides of the triangular pulse while $\phi_{i-1}$ and $\phi_{i+1}$ form two sides of the second pulse series of triangular pulse series.

The further triangular forming will be shown adding one unit to the previous index. Hence, we can write the even and odd pulse series as follows:

$$X_i^*(t) = X_{2i-1}\phi_{2i-1} + X_{2i+1}\phi_{2i+1} \quad (8)$$

$$X_{i+1}^*(t) = X_{2i}\phi_{2i} + X_{2i+2}\phi_{2i+2}$$

$$X_{i+2}^*(t) = X_{2i+1}\phi_{2i+1} + X_{2i+3}\phi_{2i+3}$$

From (8) the method of forming the triangular pulse of the even and odd pulse train is evident.

It can be clearly seen that the pulse train (8) is in good agreement with the criterion (5). But criterion (5) is too weak for the triangular pulses because it obeys the criterion even by the insertion of any T, and therefore may be used without a limit for such pulses. The previously shown math models (1) and (2) are also obeyed, as was evident from their circuit descriptions.

Considering now the pulse interpolation $$\phi = \cos^2 \Big|_{t_i}^{t_{i+1}},$$

it becomes apparent that this type of pulse interpolation is also desirable according to criterion (5). In this case we can write the interpolate signal using the cosine function index X:

$$X_i(t) = \underbrace{\cos^2 \frac{\pi}{2}\left(\frac{t}{T} - i\right)}_{\phi_1} + \underbrace{\cos^2 \frac{\pi}{2}\left(\frac{t}{T} - i - 1\right)}_{\phi_2} = \quad (9)$$

$$\cos^2 \frac{\pi}{2}\left(\frac{t}{T} - i\right) + \sin^2 \frac{\pi}{2}\left(\frac{t}{T} - i\right) = 1$$

with:

$$iT \leq t \leq (i+1)T$$

In (9) we can see the well known Pythagorean identity, which is in agreement with the criterion (5). This equation is also too weak (as in the previous case) because the function in question is valid for criterion (5) with any T, and therefore it may be used for such pulses without limit.

Using Pulse Interpolation Function $\phi=Sa(t)$, we have:

$$X^*(t) = \Sigma X_i \phi_i(t - iT)$$

where:

$$\phi_i(t - iT) = Sa_i(t - iT) = \frac{\sin\pi\left(\frac{t}{T} - i\right)}{\pi\left(\frac{t}{T} - i\right)} \quad (10)$$

$$\omega_c = \frac{\pi}{T}, \quad -\infty \leq t \leq \infty$$

In this case, there is an infinity of pulse functions and each of them has an infinite duration. As is known, the Sa(t) pulse function is not physically reliable because there is a physical violation of cause and effect (the action and reaction) so that the reaction begins earlier than the action. Therefore, it is theoretically necessary to have an infinite duration of every data $X_i$ in the receiver interpolation deviser and, therefore, the restore delay will tend also to infinity. However, we can consider the cut Sa(t) pulse by $-mT \leq t \leq mT$, in which case, it may be technologically reliable and the interpolator will act with 2mT delay. It is asserted without proof that the cut Sa(t)-pulse does not obey the condition (5) or the even weaker root-mean-square conditions:

$$\lim \int_0^T \{1 - [\phi_1(t) + \phi_2](t)\}^2 dt = 0 \quad (11)$$

$$T \to 0.$$

Our analysis, which is not included here, shows that the error according to (11) is practically independent from T, and varies only from m. It will be little enough even with a practically impossible large m.

Two types of circuit structures for the triangular pulse interpolation are shown. The first (FIG. 4a) is based on integrators, which are used to obtain triangular pulses with height proportional to $X_i$. The circuit acts by means of two-channel pulse generation in the even and odd channels and the interpolation function X(t) is obtained according to equations (7) and (8). This process has been shown in the time diagrams of FIG. 4b, which makes clear the actions of other circuit components. In order to obtain a triangular pulse by means of the integrator, it is necessary to provide a sign change operator in the d.a.c. after every period T. This means that such an operation is realized with the d.a.c. and is not shown separately.

Figure 5:
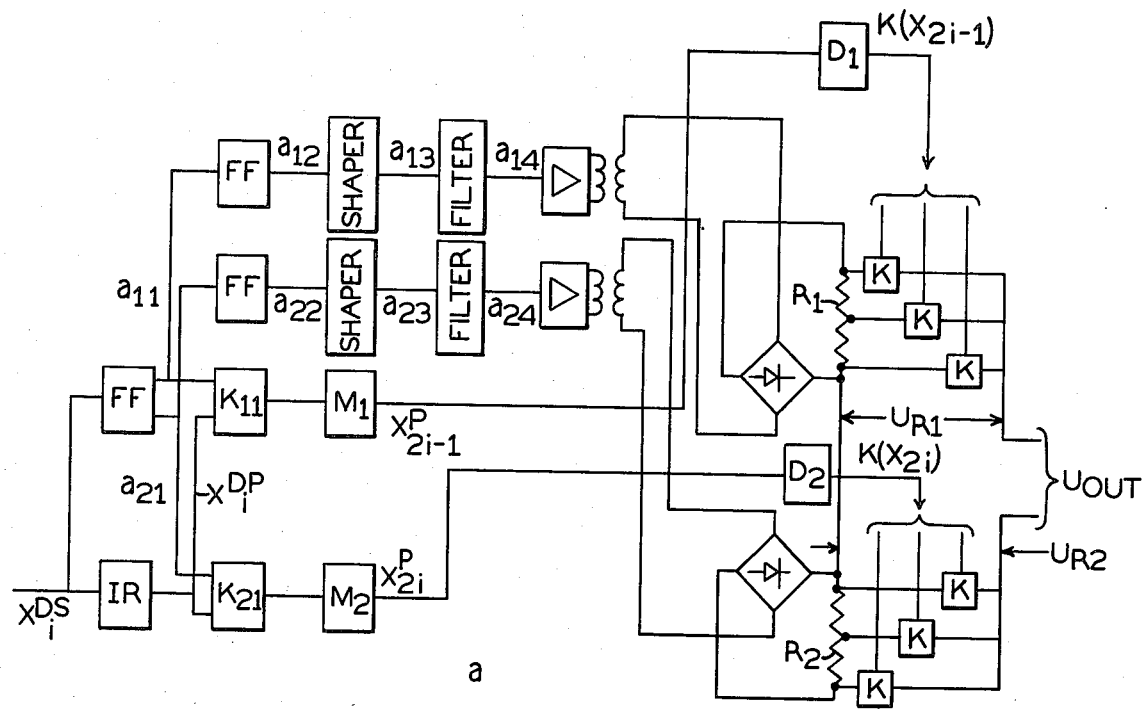
Figure 5:
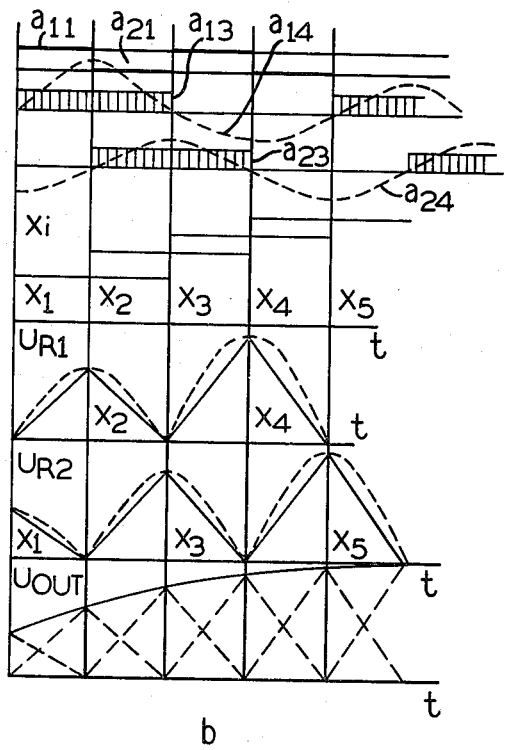

The second circuit (FIG. 5a) consists of two channels for obtaining sine and cosine functions by means of two flip-flop, pulse shaper, filter cascades, which function as illustrated in the time diagrams of FIG. 5b.

The detector diode characteristics have to form linearly the input sine signal. The diode linearization function may be written as:

$$I[U(\nu)] = I_m \nu \quad (12)$$

where:

$$0 \leq \nu = t/2T \leq 1$$

$I_m$ is maximum current and:

$$0 \leq t \leq 2T$$

The problem of the linearization process is to obtain characteristic I(U) according to the time function (12). In our case, we have:

$$U(\nu) = U_1 \sin \pi/2\nu$$

In order to obtain an analytical calculation, we can use the approximation:

$$U = U_1 \sin \pi/2\nu \approx U_1(1-)$$

and then substitute into equation (12):

$$I = \frac{U_1(1 - \nu)\nu - 2U_d}{R} = I_m \nu$$

Solving the equation for $\nu$, we obtain $\nu$ as a function of $U_d$ and therefore:

$$I(U_d) = I_m \nu(U_d)$$

Then:

$$I(U_d) \approx I_m \left[ \frac{1}{2}\left(1 - \frac{U_{Rm}}{U_1}\right) - \sqrt{\frac{1}{4}\left(1 - \frac{U_{Rm}}{U_1}\right)^2 - \frac{2U_d}{U_1}} \right]$$

where:

$$U_{Rm} = I_m R$$

The time diagram of FIG. 5b shows the action of structure FIG. 5a to obtain two triangular pulse series which are summed to give the interpolation function. The triangular amplitude $X_i$ is passed through the electronic switches, controlled from the decoders $D_2$ and $D_1$ of the even and odd channels, respectively, so that the outputs $UR_2$ and $UR_1$ of the voltage channel dividers, which are summed to form the interpolated analog output, are voltages proportional to $X_{2i}$ and $X_{2i-1}$, respectively.

It is timely to notice that the linearization of the diodes characteristic is not necessary in the case X(t) is a constant or by relatively slow changing of the initial function X(t), i.e., X(t) is relatively low. The pulse interpolation may be particularly effective for the large interpolation period T in which case filtering interpolation may not be desirable.

Figure 4:
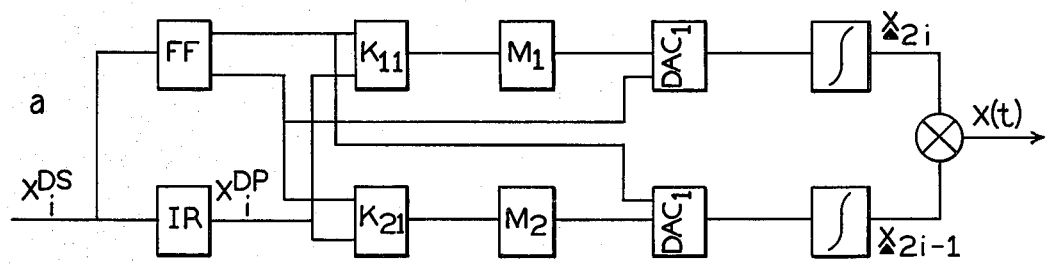
Figure 4:
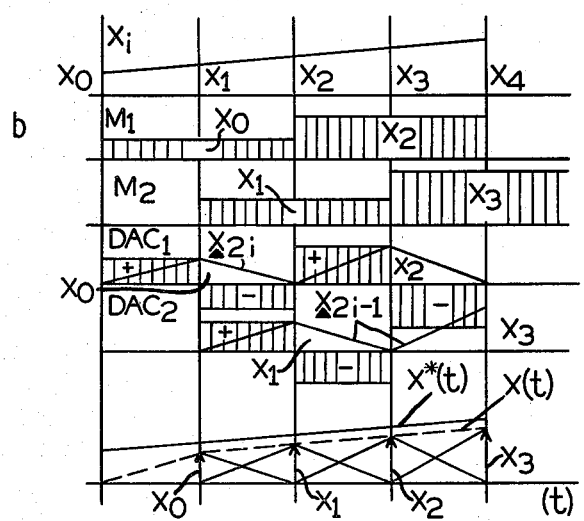

Comparing FIG. 4a and FIG. 5a, we can see that the structure of FIG. 4a does not have voltage dividers giving the triangular altitudes $X_{2i}$ and $X_{2i-1}$ and diodes with the special characteristics. But structure of FIG. 4a requires two integrators with identical stability and two d.a. converters.

In order to obtain $\cos^2$ and $\sin^2$ pulse functions, the double feeding bridge-circuit of FIG. 6a is used. The first diagonal feeds from the harmonic voltage source $U_g$ which has an assumed amplitude $\cos \pi/T$, the second from the constant voltage source E.

Using the superposition principle, we can write, assuming $R_E = R_i = 0$ (FIG. 6b):

$$\begin{cases} I_{E2} = I_{E1} = I_{E3} = I_{E4} = I_4 = \frac{E}{2R} \\\\ I_{U2} = I_{U4} = I_U = \frac{U_g \cos^2 \frac{\pi}{2T} t}{2R} \\\\ I_2 = I_E + I_U = \frac{1}{2R}\left(E + U_g \cos \frac{\pi}{T} t\right) \\\\ I_4 = I_E - I_U = \frac{1}{2R}\left(E - U_g \cos \frac{\pi}{T} t\right) \end{cases}$$

By setting $E = U_g$:

$$\begin{cases} I_2 = \frac{E}{R}\left(\frac{1 + \cos \frac{\pi}{T} t}{2}\right) = \frac{E}{R} \cos^2 \frac{\pi}{2T} t \\\\ I_3 = \frac{E}{R}\left(\frac{1 - \cos \frac{\pi}{T} t}{2}\right) = \frac{E}{R} \sin^2 \frac{\pi}{2T} t \end{cases}$$

So the two diagonal feeding bridge is given the necessary even-odd pulse series. The amplitude adjusters are obtained also by means of electronic switches controlled from the decoders $D_1$ and $D_2$.

The most important common features of the pulse interpolation structures FIGS. 4a, 5a, 6a, are that the code change takes place in the null pulse duration in both the even and odd pulse series, which gives the possibility of obtaining smooth interpolation in contrast to the structure of FIG. 2a, which causes interpolate interruption by code change. Using interpolation according to FIG. 6a makes it possible to obtain the two-phase, in space and time, amplitude modulation measuring and communication system which requires two phase detection channels for the wire communication line. In case of radio channels, special two-channel antennas are required for the communication line. This radio antenna should consist of two rectangular space oscillation axes having also interrectangular time phase shifting, so that the electromagnetic propagation field will also be the rotation oscillation field. This field should be received by a corresponding two axis rectangular antenna. Each channel must have a comprehensive signal demodulation treatment to provide two triangular pulse series for pulse interpolation according to previously described methods. This method of amplitude modulation will provide much more noise immunity.

Having thus described my invention, what I claim is:

1. A method of converting a received series of equally spaced discrete pulses, which have varying amplitudes to jointly represent an original analog signal, into an equivalent interpolated analog signal form, comprising the steps of,
   (a) successively registering each of said series of received pulses in an input register means,
   (b) alternately storing the registered pulses, each converted into a preselected signal format, in a pair of memory elements alternately actuated by the successively received pulses of said series,
   (c) generating two separate series of triangular signals with one series corresponding to the pulse signals successively stored in each memory element, each triangular signal having a base length equal to twice the spacing between successive received pulses so that alternate triangular signals of the two series overlap in duration,
   (d) selecting the amplitude of each triangular signal in accordance with the amplitude of the corresponding signal currently stored in the associated memory element, and
   (e) summing and overlapped triangular signals of selected amplitudes from both series into a continuous analog output signal substantially equivalent to the original analog signal from which said received pulses were derived.

2. A method of converting a series of pulses as defined in claim 1, in which said generating step comprises the steps of,
   (a) converting each signal stored in each memory element into an analog signal of equal amplitude,
   (b) reversing the polarity of each converted analog signal at the time the next succeeding received pulse of said series is stored in the other memory element, and
   (c) integrating each converted analog signal including the reversed polarity portion into a triangular signal overlapping the next preceding and succeeding triangular signals developed from signals stored in the other memory element,
   and which then includes the single final step of,
   (d) summing said overlapped triangular signals into a continuous analog output signal substantially equivalent to the original analog signal from which said received pulses were derived.

3. A method of converting a series of pulses as defined in claim 1, in which the generating step includes the steps of,
   (a) generating separate sine and cosine function signals, each synchronized with the storage of each pulse signal in a different one of said memory elements, and
   (b) converting said sine and cosine function signals into triangular form signals of predetermined maximum value.

4. A method of converting a series of pulses as defined in claim 1, in which,
   (a) said generating step produces separate $\sin^2$ and $\cos^2$ signal functions having a predetermined maximum amplitude, one function being associated with each memory element,
   and which includes the further steps of,
   (b) selecting in amplitude for each generated signal function in accordance with the amplitude of the signal currently stored in the associated memory element, and
   (c) summing said selected amplitude signal functions into said continuous analog output signal.

5. Conversion apparatus, for restoring a series of equally spaced discrete pulses of variable amplitude, representing an analog measurement signal and received over a single communication channel, into an equivalent analog signal, comprising:
   (a) a first and a second gate means,
   (b) a flip-flop switching means coupled to said communication channel and to both said gate means and responsive to successive received pulses for alternately actuating said gate means, (c) a first and a second memory means associated with said first and second gate means, respectively, each operable for storing the amplitude value of an applied pulse signal until another signal is applied, (d) an input registry means coupled between said channel and each memory means by the associated gate means for alternately applying a pulse signal having the equivalent value of the amplitude of each successive received pulse to said first and second memory means as said gate means are alternately actuated, and (e) generator means coupled to said first and second memory means and controlled by said flip-flop switching means for producing a triangular signal corresponding to each pulse signal stored in each memory means, each triangular signal having a base length equal to twice the spacing period between successive received pulses and an amplitude equal to the level of the corresponding pulse signal stored in said memory means, and (f) a summing network coupled to said generator means and said memory means for summing the successive triangular signals from said generator means to produce an analog output signal substantially equivalent to the original analog signal represented by said series of received pulses.

6. Conversion apparatus as defined in claim 5, in which said generating means comprises:

(a) a first and a second converter means coupled to said first and second memory means, respectively, for receiving signals stored in the associated memory means, (1) each converter means controlled by said switching means for reversing the polarity of the received signal during the time period the succeeding series pulse is being received by said input registry means, (b) a first and a second integrator means coupled for receiving the signal value from said first and second converter means, respectively, and responsive thereto for producing an output signal having a triangular form during the time the corresponding pulse is stored in the associated memory means, and in which, (c) said summing network is coupled to receive the output signals from each of said integrator means for adding these signals to produce an interpolated analog signal substantially equivalent to the original analog measurement signal represented by said series of received pulses.

7. Conversion apparatus as defined in claim 5 in which said generating means comprises, (a) a first and a second decoder means coupled to said first and second memory means, respectively, each decoder means responsive for producing an output which is a function of the associated currently stored signal value, (b) a first and second auxiliary channel means coupled to said switching means for alternately receiving input signals as said first and second gate means are actuated, (1) each channel means responsive to successive input signals for generating sine/cosine function signals phase shifted 90° from the corresponding signal generated by the other channel means, (c) a separate output means coupled to each auxiliary channel means and responsive to the corresponding sine/cosine function signals for producing a triangular output signal, and in which, (d) said summing network is coupled to both output means and controlled by both said decoder means for producing from said triangular signals an interpolated analog signal having a varying amplitude selected in accordance with the signal output function developed by each decoder means and substantially equivalent to the original analog signal represented by said series of received pulses.

8. Conversion apparatus as defined in claim 5, which further includes, (a) a first and a second decoder means coupled to said first and second memory means, respectively, each responsive for producing an output which is a function of the signal value currently stored in the associated memory means, and in which, (b) said generating means is operable for producing $cosine^2$ and $sine^2$ pulse interpolation functions, each having a predetermined maximum value, and is coupled for supplying a distinctive output signal corresponding to each decoder means, and (c) said summing network is coupled for receiving said distinctive output signals from said generating means and is controlled by both said decoder means for selecting an amplitude for each distinctive output signal in accordance with the current output function produced by the corresponding decoder means, (1) said summing network sums the selected amplitude signals to produce an interpolated analog signal substantially equivalent to the original analog signal represented by said series of received pulses.

* * * * *

UNITED STATES PATENT AND TRADEMARK OFFICE
CERTIFICATE OF CORRECTION

PATENT NO. : 4,238,831
DATED : December 9, 1980
INVENTOR(S) : Yuly M. Pulyer

It is certified that error appears in the above-identified patent and that said Letters Patent are hereby corrected as shown below:

Column 10, line 14, change "and" to --said--

Signed and Sealed this

Seventh Day of April 1981

[SEAL]

Attest:

RENE D. TEGTMEYER

Attesting Officer  Acting Commissioner of Patents and Trademarks